(12) United States Patent
Zhu et al.

(10) Patent No.: US 7,713,806 B2
(45) Date of Patent: May 11, 2010

(54) STRUCTURES AND METHODS FOR MANUFACTURING OF DISLOCATION FREE STRESSED CHANNELS IN BULK SILICON AND SOI MOS DEVICES BY GATE STRESS ENGINEERING WITH SIGE AND/OR SI:C

(75) Inventors: Huilong Zhu, Poughkeepsie, NY (US); Bruce B. Doris, Brewster, NY (US); Huajie Chen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/352,504

(22) Filed: Jan. 12, 2009

(65) Prior Publication Data

US 2009/0149010 A1  Jun. 11, 2009

Related U.S. Application Data (62) Division of application No. 11/931,387, filed on Oct. 31, 2007, now Pat. No. 7,476,580, which is a division of application No. 10/709,239, filed on Apr. 23, 2004, now Pat. No. 7,504,693.

(51) Int. Cl.
H01L 21/00 (2006.01)
H01L 21/84 (2006.01)
H01L 21/336 (2006.01)
H01L 21/8234 (2006.01)

(52) U.S. Cl. .................. 438/197; 438/509; 438/308; 438/166

(58) Field of Classification Search ............. 438/166, 438/149, 587, 588, 128, 778, 465, 142, 459, 438/256, 949, 308, 168, 705
See application file for complete search history.

(56) References Cited

U.S. PATENT DOCUMENTS 3,602,841 A  8/1971  McGroddy (Continued)

OTHER PUBLICATIONS

Kem Rim, et al., "Transductance Enhancement in Deep Submicron Strained-Si n_MOSFETs", International Electron Devices Meeting, 26, 8,1, IEEE, Sep. 1998.

(Continued)

*Primary Examiner*—Chuong A. Luu
(74) *Attorney, Agent, or Firm*—Scully, Scott, Murphy & Presser, P.C.; Joseph P. Abate, Esq.

(57) ABSTRACT

Structures and methods of manufacturing are disclosed of dislocation free stressed channels in bulk silicon and SOI (silicon on insulator) CMOS (complementary metal oxide semiconductor) devices by gate stress engineering with SiGe and/or Si:C. A CMOS device comprises a substrate of either bulk Si or SOI, a gate dielectric layer over the substrate, and a stacked gate structure of SiGe and/or Si:C having stresses produced at the interfaces of SSi (strained Si)/SiGe or SSi/Si:C in the stacked gate structure. The stacked gate structure has a first stressed film layer of large grain size Si or SiGe over the gate dielectric layer, a second stressed film layer of strained SiGe or strained Si:C over the first stressed film layer, and a semiconductor or conductor such as p(poly)-Si over the second stressed film layer.

5 Claims, 9 Drawing Sheets

U.S. PATENT DOCUMENTS

| | | | |
|---|---|---|---|
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,986,311 A * | 11/1999 | Aihara | 257/382 |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,060,656 A | 5/2000 | Dresselhaus et al. | |
| 6,066,545 A | 5/2000 | Doshi et al. | |
| 6,090,684 A | 7/2000 | Tshitsuka et al. | |
| 6,093,243 A * | 7/2000 | Okada et al. | 117/8 |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,734 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | Von Ehrenwall | |
| 6,476,462 B2 | 11/2002 | Shimizu et al. | |
| 6,492,659 B1 * | 12/2002 | Yamazaki et al. | 257/59 |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 2001/0009784 A1 | 7/2001 | Ma et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |

OTHER PUBLICATIONS

Kem Rim, et al., "Characteristics and Device Design of Sub-100 nm Strained Si N- and PMOSFETs", 2002 Symposium On VLSI Technology Digest if Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Apr. 2000.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito et al., "Mechanical Stress Effect of Etch-Stop Nitride and its Impact on Deep Submicron Transistor Design", International Electron Devices Meeting, 10.7.1, IEEE Apr. 2000.

A. Shimizu, et al. "Local Mechanical-Stress Control (LMC): A New Technique for CMOS-Performance Enhancement" Internati Electron Devices Meeting, IEEE, Mar. 2001; and.

K. Ota, et al., "Novel Locally Strained Channel Technique for high Performance 55nm CMOS", International Electron Devices Meeting, 2.2.1, IEEE, Feb. 2002.

* cited by examiner

FIG. 12
SCHEMATIC OF LAYER STRUCTURE BEFORE GATE PATTERNING

FIG. 18

STRUCTURES AND METHODS FOR MANUFACTURING OF DISLOCATION FREE STRESSED CHANNELS IN BULK SILICON AND SOI MOS DEVICES BY GATE STRESS ENGINEERING WITH SIGE AND/OR SI:C

RELATED APPLICATIONS

This application is a divisional application of U.S. Ser. No. 11/931,387, filed Oct. 31, 2007 now U.S. Pat. No. 7,476,580, which is a divisional application of U.S. Ser. No. 10/709,239, filed Apr. 23, 2004 now U.S. Pat. No. 7,504,693.

BACKGROUND OF THE INVENTION

1. Field of the Invention

The present invention relates generally to structures and methods of manufacturing dislocation free stressed channels in bulk silicon and SOI (silicon on insulator) MOS (metal oxide semiconductor) devices by gate stress engineering with SiGe and/or Si:C.

Dislocations are defects in crystal structures, and disadvantageously can provide current paths for leakage currents in bulk silicon and SOT CMOS devices having such dislocations.

2. Summary of the Invention

The present invention provides structures and methods of manufacturing dislocation free stressed channels in bulk Si and Sol MOS (metal oxide semiconductor) devices by gate stress engineering with SiGe and/or Si:C. A MOS device comprises a substrate of either bulk Si or SOI, a gate dielectric layer over the substrate, and a stacked gate structure of SiGe and/or Si:C having stresses produced at the interfaces of SSi(strained Si)/SiGe or SSi/Si:C in the stacked gate structure. The stacked gate structure has a first stressed film layer of large grain size Si or SiGe over the gate dielectric layer, a second stressed film layer of strained Si or strained SiGe or strained Si:C over the first stressed film layer, and a semiconductor or conductor such as p(poly)-Si or silicide over the second stressed film layer.

The description herein discusses both stresses and strains, and it should be realized that stress and strain are related, with stress being proportional to strain, equaling a constant multiplied by the strain. Moreover, strong strain often creates dislocations in crystal structures. The description herein also refers to tensile stress which refers to stress applied in nFET channels and compressive stress which refers to stress in a pFET channels.

The present invention:

avoids dislocations generated in channels of bulk silicon and SOT (silicon on insulator) MOS (metal oxide semiconductor) devices;

applies different types of stresses to nFET and pFET devices, separately;

overcomes etch and clean processes of SiGe that can cause broken narrow electrical lines;

applies stress by SiGe for ultra-thin SOI devices;

overcomes dislocation generation increases at higher temperatures. This restricts the use of a thick metastable layer of strained Si (SSi) grown at relatively low temperatures (e.g. 550 C) since SD RTA (source, drain, rapid thermal anneal);

overcomes problems associated with the requirement that high Ge % SSi/SiGe require the SSi to be very thin in order to reduce the generation of dislocations. However, if the strained Si is too thin, (e.g. 5 nm, corresponding to 35% Ge critical thickness), the interface of SSi/SiGe can degrade mobility.

The present invention:

provides structures and methods for making strained bulk Si and SOT CMOS devices by stressed gate engineering using stacked gates of SiGe and Si:C;

allows the use of large Ge % and thickness of SiGe to produce large stresses due to the interfaces of SSi/SiGe or SSi/Si:C in the gates; provides stressed films of SSi/SiGe and SSi/Si:C that are more stable due to the process of replacement partial gate (refers to the replacement of a part of the poly in a gate, as disclosed and discussed hereinbelow) occurring after high temperature processes (e.g. SD RTA);

controls the stress in the channels of the devices by tuning Ge % or C % in SiGe or Si:C or by changing the thickness of the films;

can be applied directly to bulk Si and SOI technologies without changing the conventional diffusion processes of the front-end-of-line (FEOL) processes.

BRIEF DESCRIPTION OF THE DRAWINGS

The foregoing objects and advantages of the present invention for structures and methods for manufacturing of dislocation free stressed channels in bulk silicon and SOI CMOS devices by gate stress engineering with SiGe and/or Si:C may be more readily understood by one skilled in the art with reference being made to the following detailed description of several embodiments thereof, taken in conjunction with the accompanying drawings wherein like elements are designated by identical reference numerals throughout the several views, and in which:

FIG. 1 illustrates the structure after the completion of steps 1 and 2 that use conventional processes to form a gate oxide on a Si substrate and depositing a-Si or poly-Si, and annealing to obtain poly-Si with a large grain size.

FIG. 2 illustrates the structure after step 3 involving oxidation and etching of the oxide on the large grain poly-Si layer until reaching ~10 nm thickness.

FIG. 3 illustrates the structure after step 4 involving depositing p(poly)-SiGe to form a stacked-gate layer.

FIG. 4 illustrates the structure after step 5 that follows conventional processes for replacement gate to make devices with p-SiGe in the gates and spacers around the gates.

FIG. 5 illustrates the structure after step 6 that involves depositing oxide, followed by CMP (chemical mechanical polishing), stopping on the top of the gates, and depositing a thin nitride layer.

FIG. 6 illustrates the structure after step 7 that involves covering and patterning the pFETs with photoresist, etching the nitride and selectively etching the p-SiGe gates for the nFETs.

FIG. 7 illustrates the structure after step 8 that involves removing the photoresist, selective epi of strained c-SiGe, refilling the poly-Si in the nFETs and CMP stopping on the oxide.

FIG. 8 illustrates the structure after step 9 that involves depositing a thin nitride layer and photoresist and generally repeating steps 6 and 7, but this time covering the nFETs and processing the pFETs.

Step 1 starts with a conventional wafer on a single crystal Si (c-Si) substrate 140, and follows conventional processes to make a gate oxide layer 142 on the Si substrate, and then deposits a thin layer (e.g. thickness ~25 nm) of a-Si 144, as shown in FIG. 14.

DETAILED DESCRIPTION OF THE INVENTION

FIGS. 1 through 8 illustrate the fabrication process steps of a first embodiment of the present invention.

Figure 1:
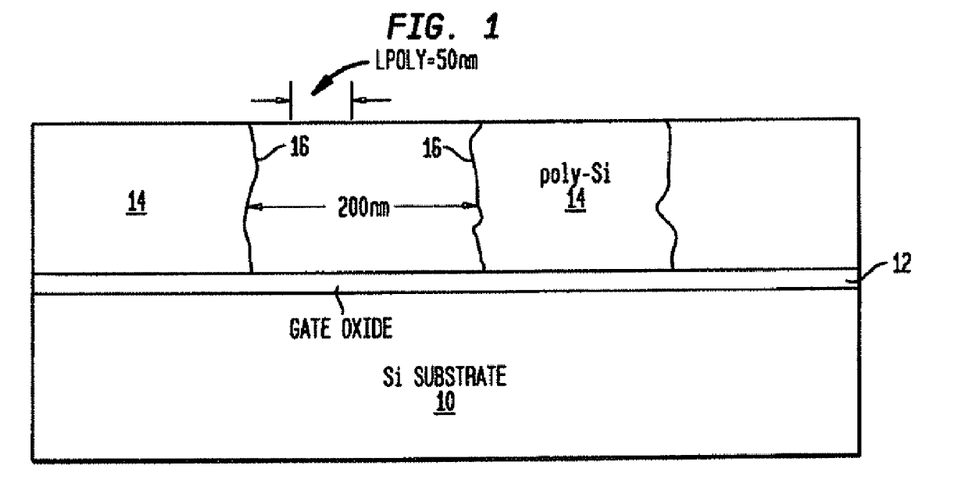
FIGS. 1 through 8 illustrate the fabrication process steps of a first embodiment of the present invention.

FIG. 1 illustrates the structure after the completion of steps 1 and 2. Step 1 uses conventional processes to form a gate oxide 12 on a Si substrate 10 (alternate embodiments can employ an SOI technology) of a wafer, and step 2 involves depositing a-Si (amorphous silicon) or poly-Si, and annealing the a-Si or poly-Si to obtain poly-Si 14 with a large grain size. If the grain size is approximately 200 nm, as shown in FIG. 1, for a 50 nm gate device (shown as Lpoly=50 nm), there is a 75% probability of not seeing a grain boundary 16 in the lateral direction of the gate, as illustrated by FIG. 1. The grain boundaries assist in relieving stress in the material.

Figure 2:
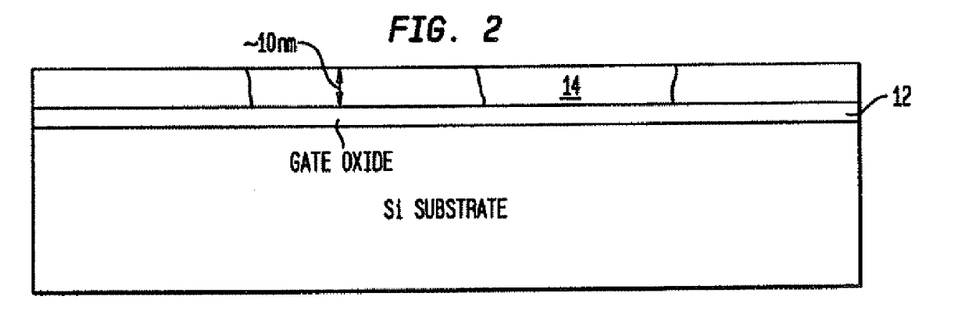

FIG. 2 illustrates the structure after step 3 involving oxidation and etching the oxide on the large grain poly-Si layer until reaching ~10 nm thickness.

Figure 3:
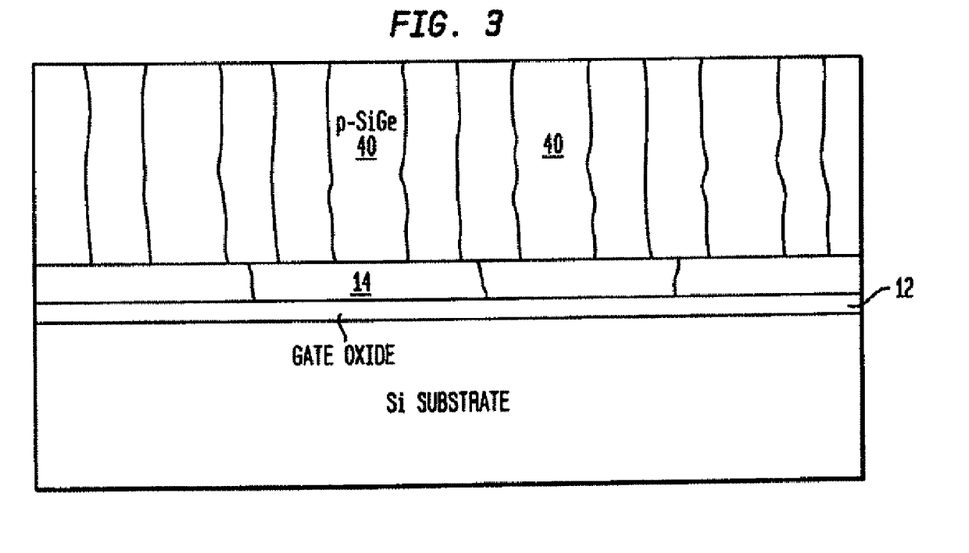

FIG. 3 illustrates the structure after step 4 involving depositing p(poly)-SiGe to form a stacked-gate layer 40.

Figure 4:
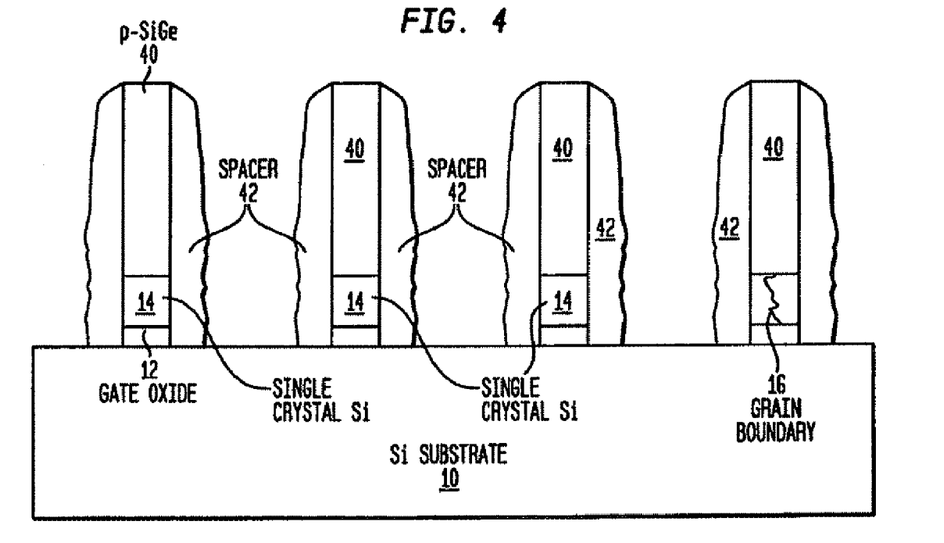

FIG. 4 illustrates the structure after step 5 that follows conventional processes for replacement gate to make devices with p-Side 40 in the gates and spacers 42 around the gates. Note that all dopants are in place and annealed to become active and no further diffusion is needed for dopant activation.

Figure 5:
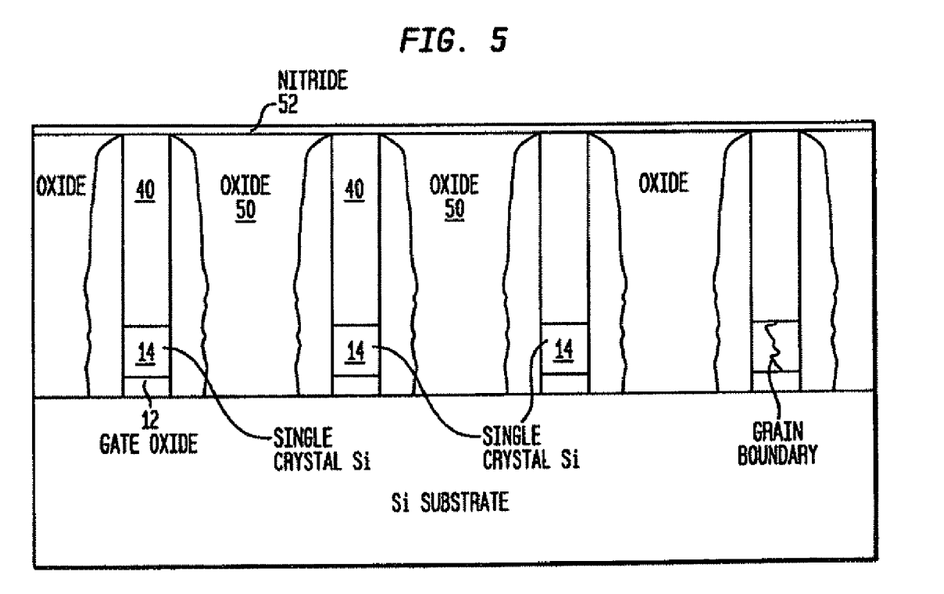

FIG. 5 illustrates the structure after step 6 that involves depositing oxide 50, followed by CMP (chemical mechanical polishing), stopping on the top of the gates, and depositing a thin nitride layer 52 to prevent epi (epitaxial crystal growth), on the top of the gates when the nFETs and pFETs are processed separately.

Figure 6:
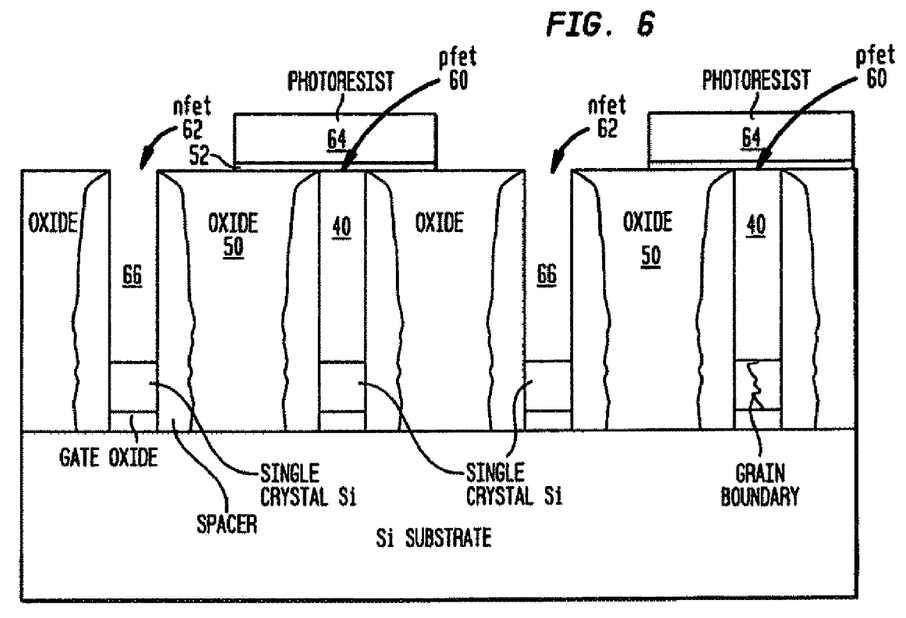

FIG. 6 illustrates the structure after step 7 that involves covering and patterning the pFETs 60 with photoresist 64, etching the nitride 52 and selectively etching the p-SiGe 40 gates at 66 for nFETs 62. The purpose of covering the pFETs is to produce different levels or types of stresses in the nFET devices and the pFET devices, separately.

Figure 7:
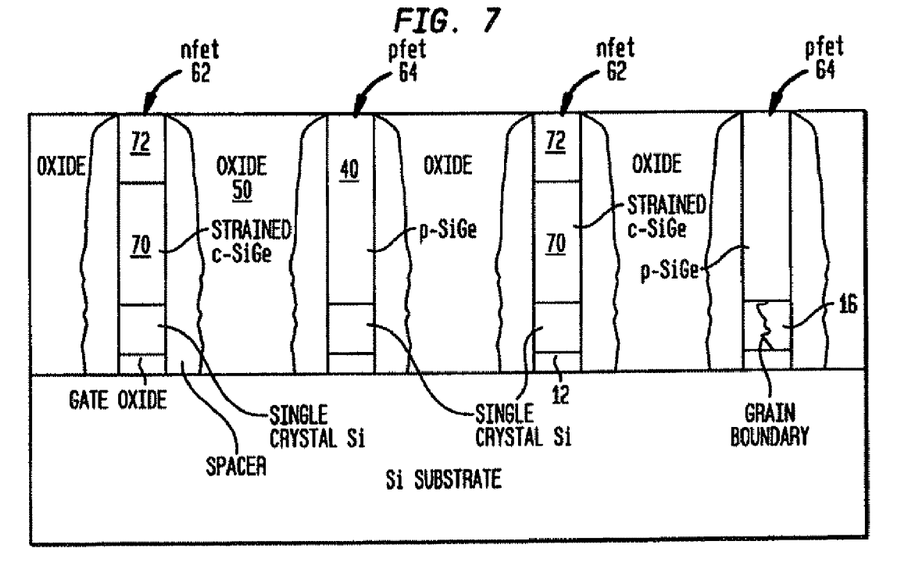

FIG. 7 illustrates the structure after step 8 that involves removing the photoresist 64, selective epi (epitaxial crystal growth) of strained c-SiGe (single crystal) 70 (<critical thickness and may need in-situ doping for the gate), refilling the poly-Si at 72 in the nFETs 62 and CMP stopping on the oxide 50, and perhaps etch back a little in the nFETs 62.

Figure 8:
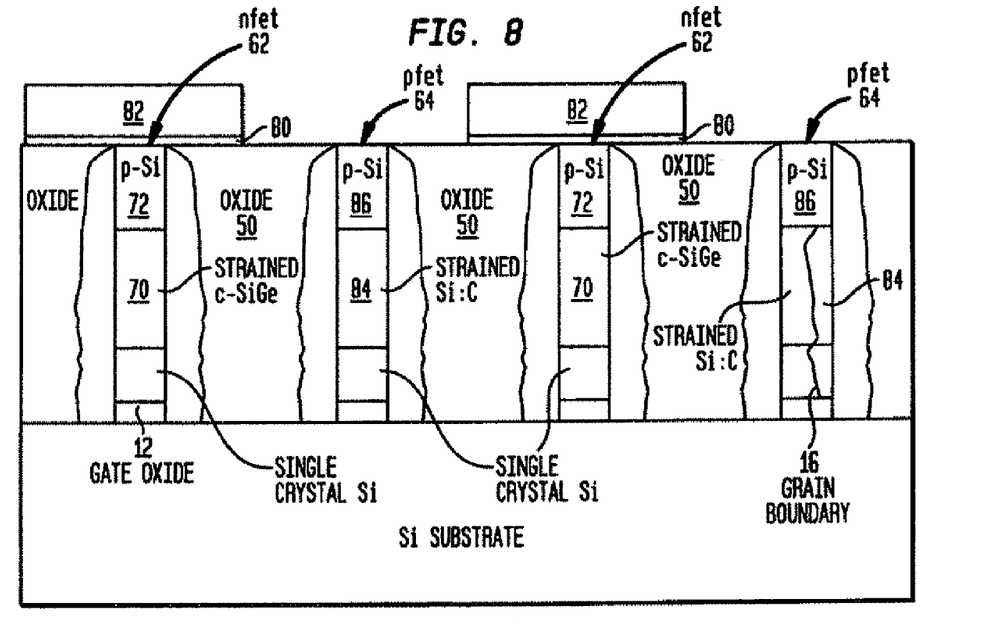

FIG. 8 illustrates the structure after step 9 that involves depositing a thin nitride layer 80 and photoresist 82 and generally repeating steps 6 and 7, but this time covering the nFETs 62 and processing the pFETs 64; using strained Si:C 84 to replace SiGe for the pFETs and then refilling poly-Si at 86 and CMP stopping at the oxide 50. FIG. 8 illustrates the grain boundary 16 continuing into the strained Si:C. FIG. 8 illustrates the completed stacked gate structure of the first embodiment, and after this step, conventional processes are used to form silicide for the gates and finish the back-end-of-line (BEOL) work.

Another option involves covering the nFET regions and doing carbon implantation into the pFET gates, and annealing at 700 C-850 C to produce tensile stress in the implanted areas in the pFET gates.

Figure 9:
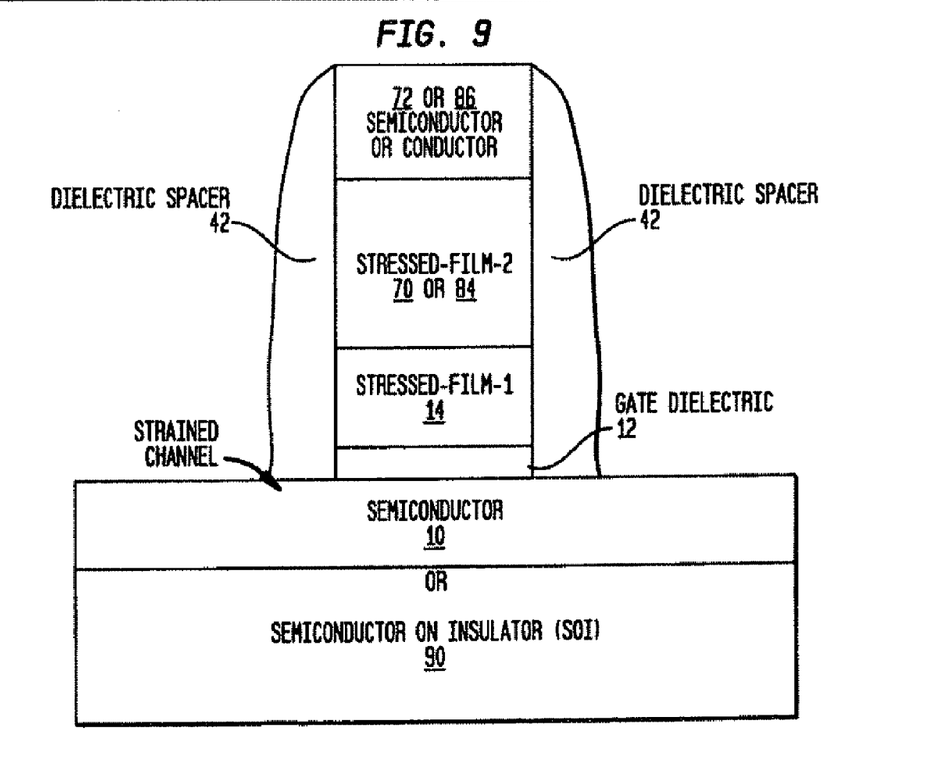
FIG. 9 illustrates a completed bulk silicon or SOI CMOS device with gate stress engineering with SiGe and/or Si:C.

FIG. 9 illustrates a completed strained bulk silicon or SOI MOS device with gate stress engineering using a stacked gate of SiGe and/or Si:C to produce stresses produced by the interfaces of SSi/SiGe or SSi/Si:C in the stacked gate structure. FIG. 9 illustrates that the devices can be fabricated on a substrate of either bulk semiconductor (Si) 10 or semiconductor on insulator (SOI) 90, and include a gate dielectric layer on top of the substrate, and a stacked gate structure having a first semiconductor or conductor stressed film layer 14 of single crystal or large grain size Si or SiGe over the gate dielectric layer 12, a second semiconductor or conductor stressed film layer 70 or 84 of strained c-SiGe or strained c-Si:C over the first stressed film layer, and a semiconductor or conductor film 72 or 86 such as p-Si over the second stressed film layer, and dielectric spacers 42 around the stacked gate structure. The stress/strain in the gates can be produced in different embodiments by different materials or by different percentages of materials.

Figure 10:
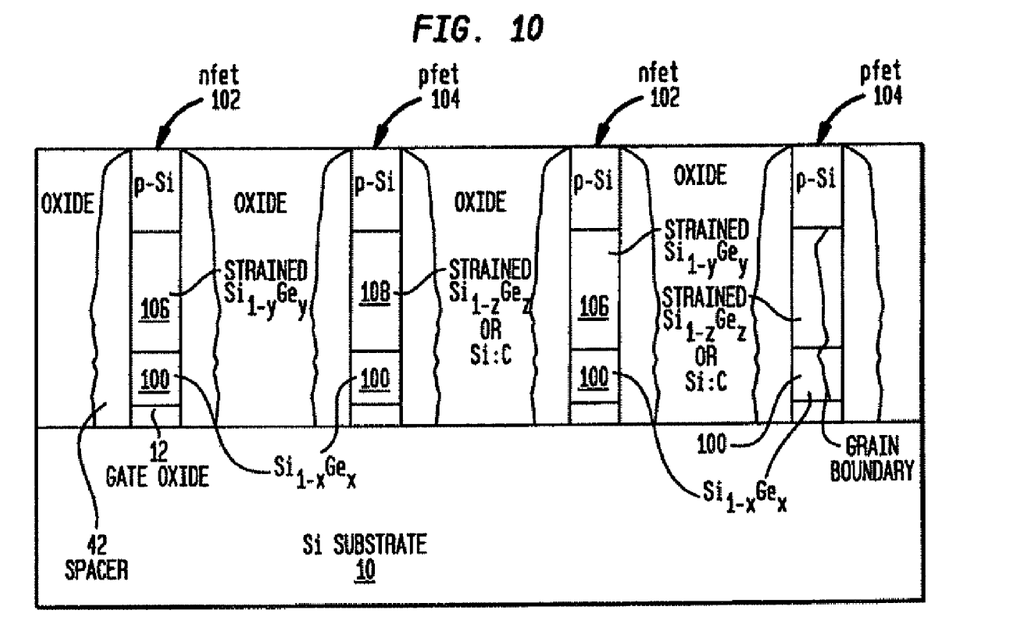
FIG. 10 illustrates a second embodiment of the present invention that follows process steps similar to the process steps of the first embodiment, but uses relaxed large-grain-size p-$Si_{1-x}Ge_x$ 100 instead of p-Si as the first gate layer or seed layer to grow the stressed film in the gate.

FIG. 10 illustrates a second embodiment of the present invention that follows process steps similar to the process steps of the first embodiment, but uses relaxed large-grain-size p-$Si_{1-x}Ge_x$ 100 instead of p-Si as the first gate layer, which is used as a seed layer to grow the stressed film in the gate. This layer is strained after the selective epitaxial growth step. The percentages of materials can be changed in different embodiments to obtain different stresses. In step 4 of the first embodiment, p-SiGe deposition is replaced by p-Si deposition. Similarly, in steps 7 and 8 of the first embodiment, the selective etching steps of p-SiGe become selective etching of p-Si. In this case, in the gate of nFETs 102, $Si_{1-y}Ge_y$ (y>x) 106 is grown, and in the gate of pFETs 104, $Si_{1-z}Ge_z$ (z<x) 108 is grown. Therefore, the process results in compressive stress in pFET channels and tensile stress in nFET channels. For the pFETs, the process can also use Si:C instead of $Si_{1-z}Ge_z$ (z<x), although SiGe has a better thermal stability than Si:C. The value of x can also be used to adjust the pFET Vt (threshold voltage). Usually, this requires less halo doping in the pFET channel which can further improve pFET performance. FIG. 10 illustrates the final resultant structure after all of the process steps are performed. The $Si_{1-x}Ge_x$ 100 is the seed layer for the parts of the gates above it, and this layer is strained after the selective epitaxial growth.

Figure 11:
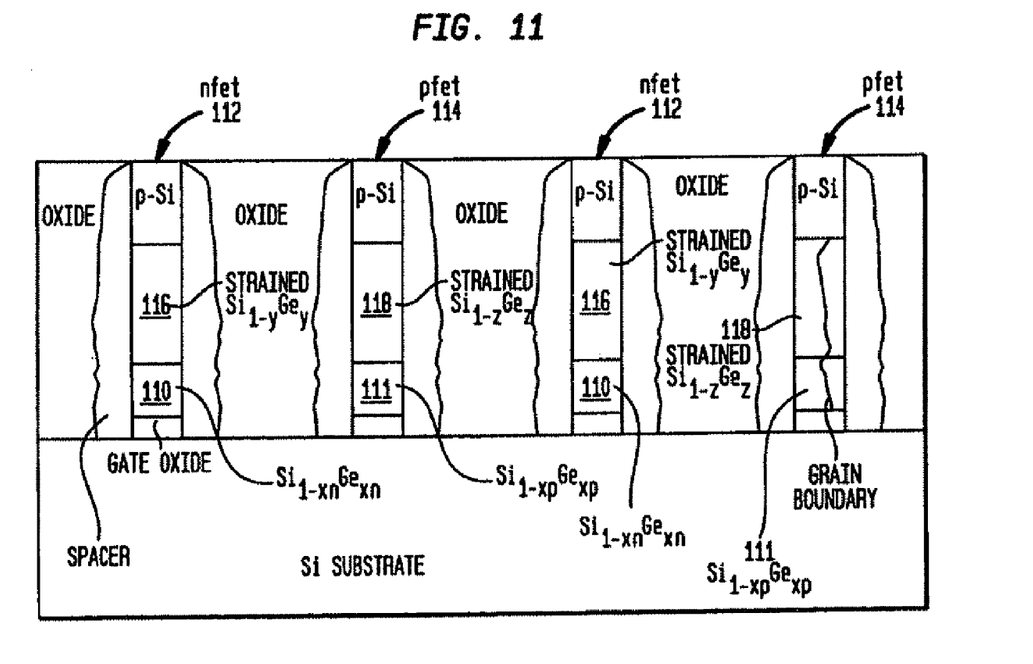
FIG. 11 illustrates a third embodiment of the subject invention that can follow processes similar to the second embodiment, but wherein the seed layers for the nFETs and the pFETs have a different Ge fraction, e.g. for nFETs p-$Si_{1-xn}Ge_{xn}$ 110 and for pFETs p-$Si_{1-xp}Ge_{xp}$ 111.

FIG. 11 illustrates a third embodiment of the subject invention that can follow processes similar to the second embodiment, but wherein the seed layers for the nFETs 112 and the pFETs 114 have a different Ge fraction, e.g. for nFETs 112 p-$Si_{1-xn}Ge_{xn}$ 110 and for pFETs 114 p-$Si_{1-xp}Ge_{xp}$ 111. This process can use conventional processes that cover the pFET and the nFET regions, separately. In this case, in the gates of the nFETs, $Si_{1-y}Ge_y$ (y>xn) 116 is grown and in the gates of pFETs, $Si_{1-z}Ge_z$ (z<xp) 118 is grown. Therefore, the process obtains compressive pFET channels and tensile nFET channels. For the pFETs, the process can also can use Si:C instead of $Si_{1-z}Ge_z$ (z<x) 118, although SiGe has a better thermal stability than Si:C. The value of x also can be used to adjust the pFET Vt. Usually, this requires less halo doping in the pFET channels which can further improve pFET performance. FIG. 10 illustrates the final resultant structure. The $Si_{1-xn}Ge_{xn}$ 110 seed layer for the part of gate above this seed layer and this seed layer are strained after the selective epitaxial growth. The $Si_{1-xp}Ge_{xp}$ 111 seed layer for the part of gate above this seed layer and this seed layer are strained after the selective epitaxial growth.

Figure 12:
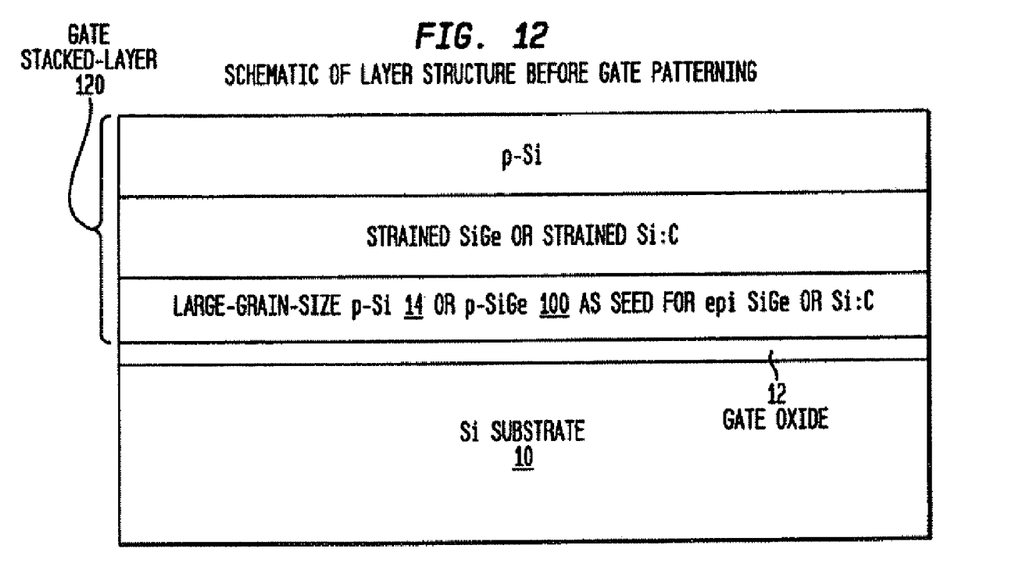
FIG. 12 illustrates a fourth embodiment of the present invention using a different process to make stressed layers in the gates by forming the gate stacked layer before gate patterning, to obtain the same structures as in the first, second and third embodiments.

FIG. 12 illustrates a fourth embodiment of the present invention using a different process, probably easier, to make stressed layers in the gates by forming the gate stacked layer 120 before gate patterning, as shown in FIG. 12, to obtain the same structures as in the first, second and third embodiments. Simulations have shown that although structure-wise they are the same, the stresses produced by the first, second and third embodiment processes are ~30% larger than those generated by the fourth embodiment. The strained SiGe or strained Si:C layer could have different stress levels, different stress types, and different Ge fractions in the nFET and pFET regions, separately. The large-grain-size p-Si 14 or p-SiGe 100 as seed for the epi SiGe or Si:C layer could have different stress levels, different stress types, and different Ge fractions in the nFET and pFET regions, separately.

Figure 13:
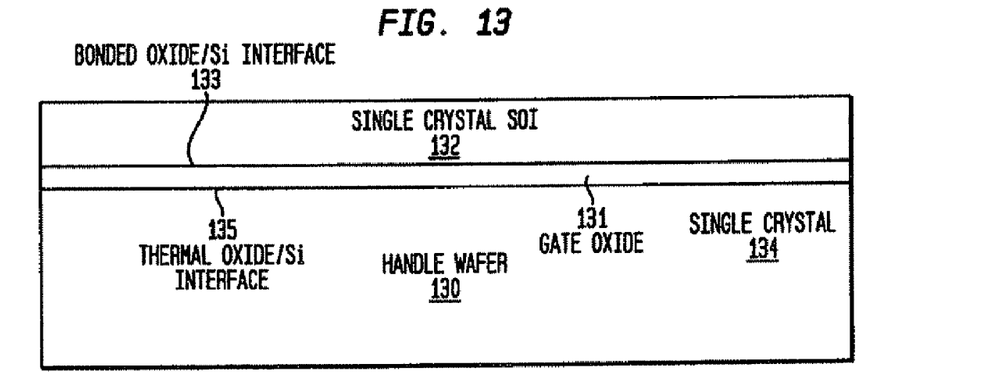
FIG. 13 illustrates a fifth embodiment of the subject invention in a process using a bonded handle wafer with two single crystalline Si layers having a respective bonded oxide/Si interface and a thermal oxide/Si interface.

FIG. 13 illustrates a fifth embodiment of the subject invention. One drawback for the first through fourth embodiments is the difference of crystalline orientations among grains in the stacked-gates. This may cause performance variations of narrow width devices since there may be only one grain in their gate. To avoid this problem, a process can use a bonded handle wafer 130 with two single crystalline Si layers 132, 134 having a respective bonded oxide/Si interface 133 and a thermal oxide/Si interface 135 as shown in FIG. 12. This structure can be used to replace the structure shown in step 2 of the first embodiment, and then follow the rest of the steps of the first through fourth embodiments to make strained silicon devices. To take advantage of Smart-Cut (which is a method to cut the wafer after bonding by employing an H implant to damage the single crystal Si 132 and then cutting/breaking along the damaged implant), the process can deposit a thin metal or silicide layer on the gate oxide 131 before bonding to the handle wafer 130. The thin metal or silicide layer can be used to tune the threshold voltage Vt of the devices, or to obtain a thinner electrical dielectric thickness for a given thickness of gate oxide.

Figure 14:
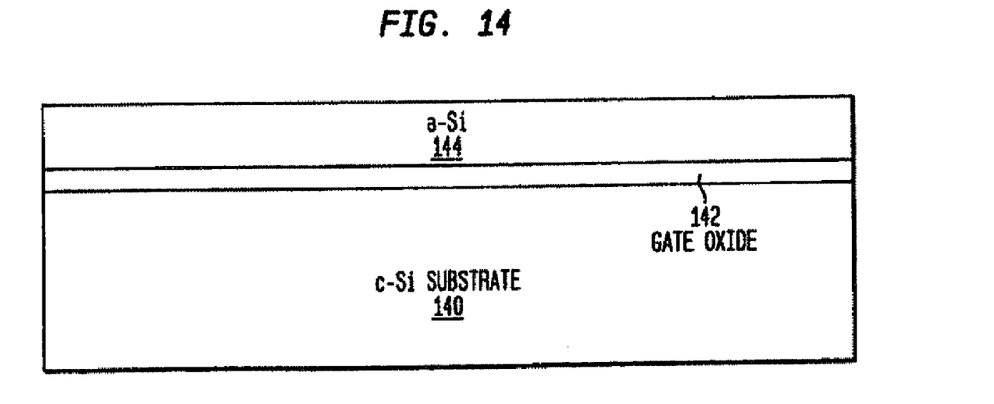
FIG. 14 illustrates a sixth embodiment of the subject invention with another process to make the structure with the double single crystal layers as shown in the fifth embodiment. This process uses regrowth of single crystal from an a-Si layer, starting the a seeds near the gates.

FIG. 14 illustrates a sixth embodiment of the subject invention with another process to make the structure with the double single crystal layers as shown in the fifth embodiment. This process uses regrowth of single crystal from an a-Si layer, starting the a seeds near the gates.

Step 1 starts with a conventional wafer on a single crystal c-Si substrate 140, and follows conventional processes to make a gate oxide layer 142 on the Si substrate, and then deposits a thin layer (e.g. thickness ~25 nm) of a-Si 144, as shown in FIG. 14.

Figure 15:
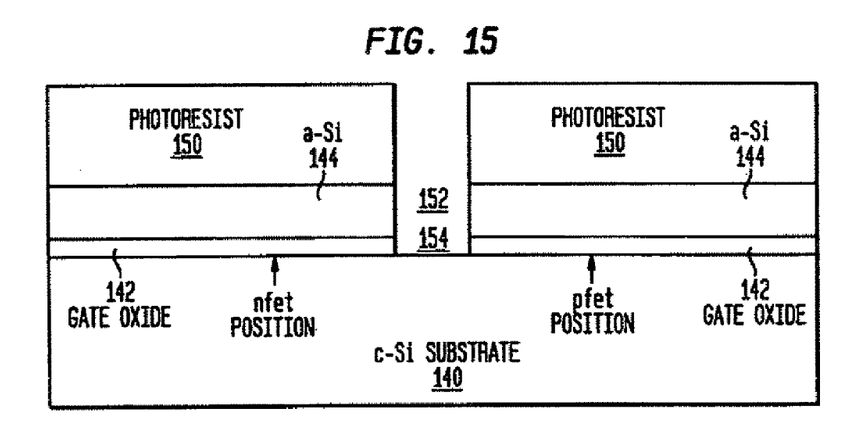
FIG. 15 illustrates the structure after step 2 involving depositing and patterning the photoresist, etching the a-Si, and etching the gate oxide.

FIG. 15 illustrates the structure after step 2 involving depositing and patterning the photoresist 150, etching the a-Si at 152, and etching the gate oxide at 154.

Figure 16:
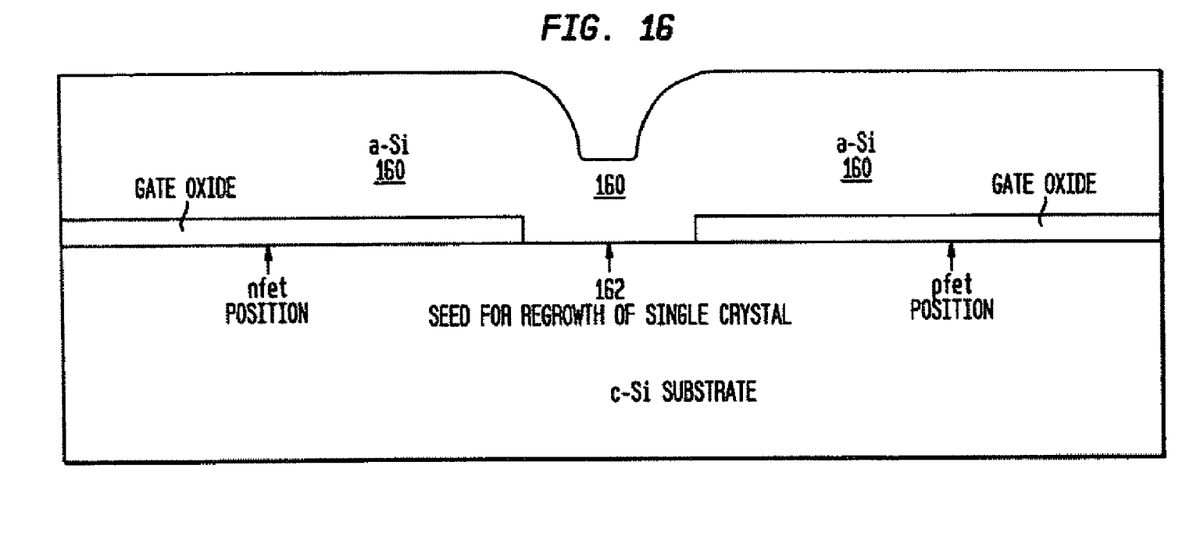
FIG. 16 illustrates the structure after step 3 involving removing the photoresist and depositing a-Si (~25 nm).

FIG. 16 illustrates the structure after step 3 involving removing the photoresist 150 and depositing a-Si (~25 nm) 160, and also shows the seed 162 for regrowth of single crystal.

Figure 17:
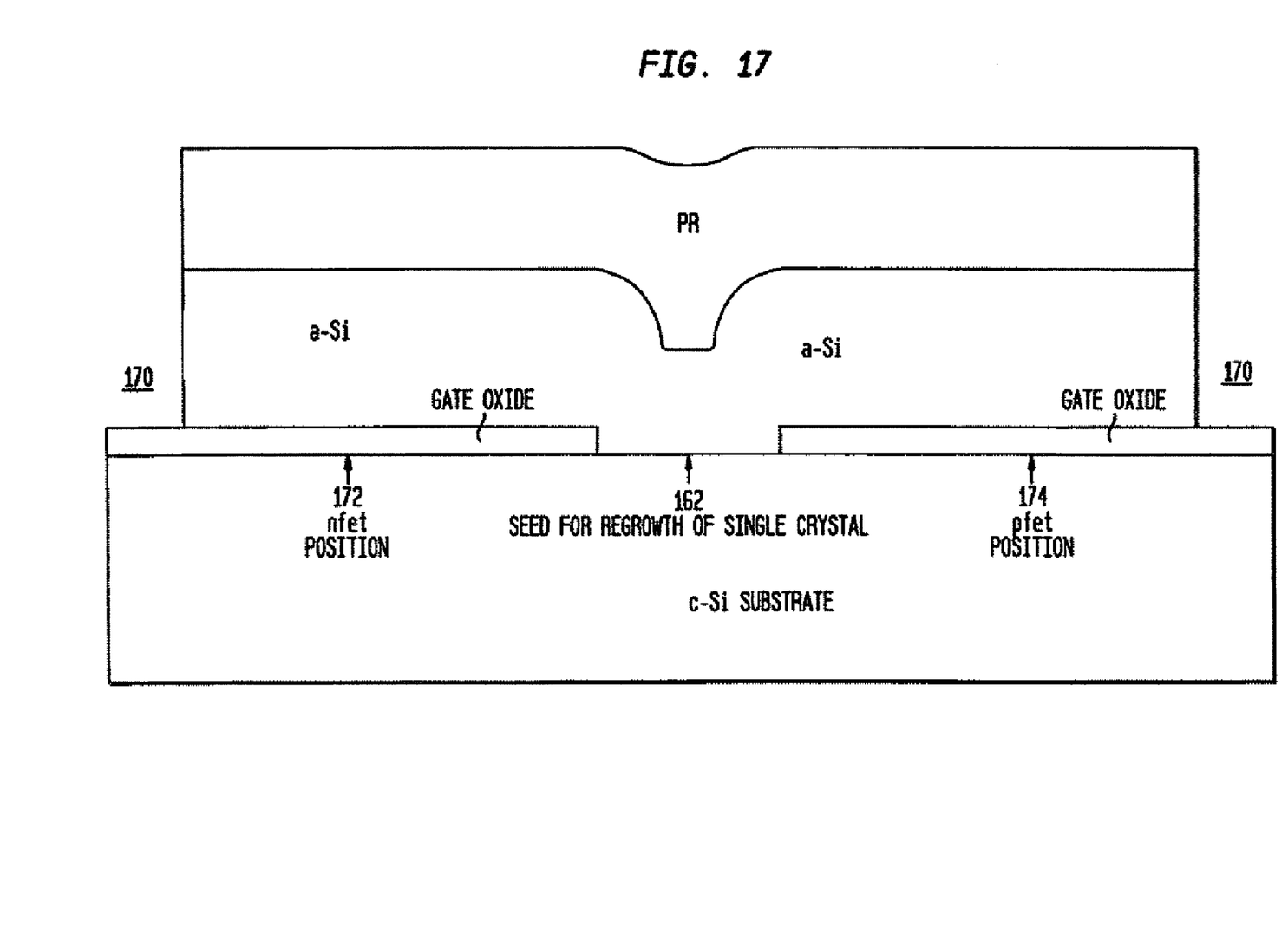
FIG. 17 illustrates the structure after step 4 involving patterning the photoresist such that it still covers both the nFET regions and the pFET regions, and etching the a-Si down to the gate oxide in order to isolate the nFET regions and the pFET regions for regrowth of crystal Si.

FIG. 17 illustrates the structure after step 4 involving patterning the photoresist such that it still covers both the nFET regions 172 and the pFET regions 174, and etching the a-Si at 170 down to the gate oxide in order to isolate the nFET regions 172 and the pFET regions 174 for regrowth of crystal Si at 162, which is also the region of STI (shallow trench isolation), such that removal of the gate oxide is not a problem.

Figure 18:
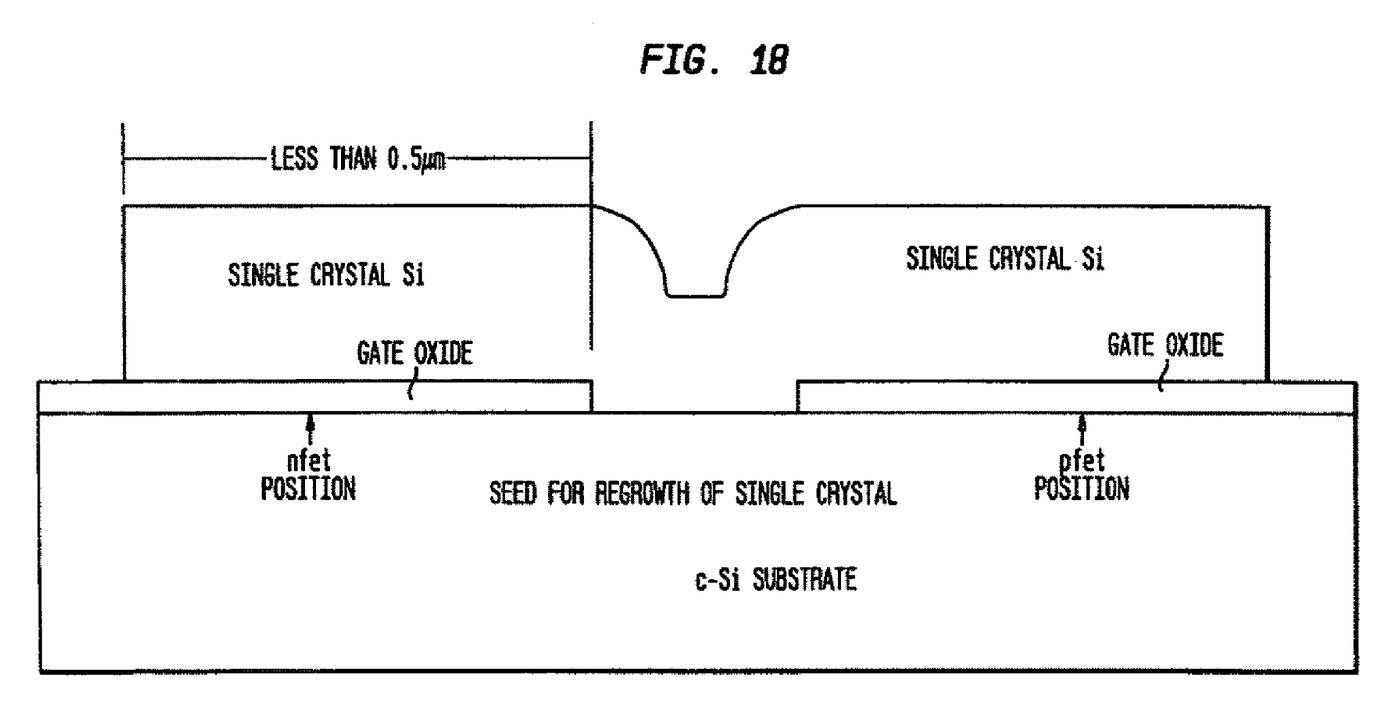
FIG. 18 illustrates the structure after step 5 involving annealing to recrystallize the a-Si layer to form single crystal Si.

FIG. 18 illustrates the structure after step 5 involving annealing at 570 C for 10 hours to recrystallize the a-Si layer to form single crystal Si 180 (Brian J. Greene et al). In this condition, a-Si can regrow as long as ~1 um in the lateral direction, and usually the total width of the device is less than 0.5 um for high performance devices. After this step, the processes described in the first through fourth embodiments can be used to make devices with the same crystalline orientations in their gates. The position of the seed for regrowth of single crystal is also the place of STI such that removal of the gate oxide is fine.

While several embodiments and variation of the present invention for structures and methods for manufacturing of dislocation free stressed channels in bulk and SOI MOS devices by gate stress engineering with SiGe and/or Si:C are described in detail herein, it should be apparent that the disclosure and teachings of the present invention will suggest many alternative designs to those skilled in the art.

Having thus described our invention, what we claim as new and desire to secure by Letters Patent is:

1. A method of fabricating a MOS (metal oxide semiconductor) device comprising:
   providing a single crystal Si substrate;
   forming a gate oxide on the single crystal Si substrate and an amorphous-Si layer on the gate oxide;
   forming an opening through the amorphous-Si layer and the gate oxide to provide an exposed surface of the single crystal Si substrate;
   forming an amorphous-Si seed layer on the exposed surface of the single crystal Si substrate, and
   annealing the structure to recrystallize the amorphous-Si layer on the gate oxide to form single crystal Si.

2. The method of claim 1 wherein the MOS (metal oxide semiconductor) device includes pFET regions, nFET regions or a combination thereof.

3. The method of claim 1 wherein the annealing comprises a temperature of 570 C for 10 hours.

4. The method of claim 1 wherein the single crystal Si is regrown to a length as great as 1 μm.

5. The method of claim 1 wherein the amorphous-Si layer has a thickness of less than 25 nm.

* * * * *